United States Patent [19]

Pitts et al.

[11] Patent Number: 4,547,432
[45] Date of Patent: Oct. 15, 1985

[54] METHOD OF BONDING SILVER TO GLASS AND MIRRORS PRODUCED ACCORDING TO THIS METHOD

[75] Inventors: John R. Pitts, Golden; Terence M. Thomas, Arvada; Alvin W. Czanderna, Lakewood, all of Colo.

[73] Assignee: The United States of America as represented by the United States Department of Energy, Washington, D.C.

[21] Appl. No.: 636,511

[22] Filed: Jul. 31, 1984

[51] Int. Cl.$^4$ .............................................. B32B 9/04
[52] U.S. Cl. .................................... 428/448; 156/643; 156/663; 427/35; 427/38; 427/54.1; 427/167; 427/294; 427/309; 427/314; 427/399; 427/404; 428/450; 428/469; 428/480; 428/701; 428/912.2
[58] Field of Search .................. 427/38, 54.1, 35, 167, 427/294, 309, 314, 399, 404; 428/448, 450, 469, 480, 701, 912.2; 156/643, 663

[56] References Cited

PUBLICATIONS

Materials Science and Engineering, vol. 53, Maddin, pp. 1–168.
Solar Energy Materials 3, 1980, 301–316, Bieg et al.
Optics Communication, vol. 8, No. 3, 7–73, Hass et al., 183–185.
Hass et al., Applied Optics, Nov 1975, vol. 14, No. 11, 2639–2644.

*Primary Examiner*—Bernard D. Pianalto
*Attorney, Agent, or Firm*—Kenneth L. Richardson; John M. Albrecht; Judson R. Hightower

[57] ABSTRACT

A method for adhering silver to a glass substrate for producing mirrors includes attaining a silicon enriched substrate surface by reducing the oxygen therein in a vacuum and then vacuum depositing a silver layer onto the silicon enriched surface. The silicon enrichment can be attained by electron beam bombardment, ion beam bombardment, or neutral beam bombardment. It can also be attained by depositing a metal, such as aluminum, on the substrate surface, allowing the metal to oxidize by pulling oxygen from the substrate surface, thereby leaving a silicon enriched surface, and then etching or eroding the metal oxide layer away to expose the silicon enriched surface. Ultraviolet rays can be used to maintain dangling silicon bonds on the enriched surface until covalent bonding with the silver can occur. This disclosure also includes encapsulated mirrors with diffusion layers built therein. One of these mirrors is assembled on a polymer substrate.

17 Claims, 19 Drawing Figures

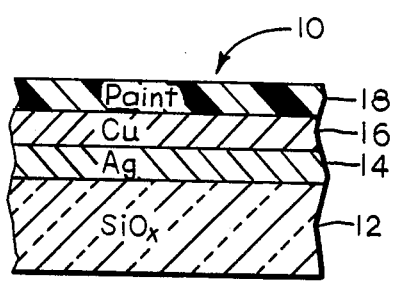
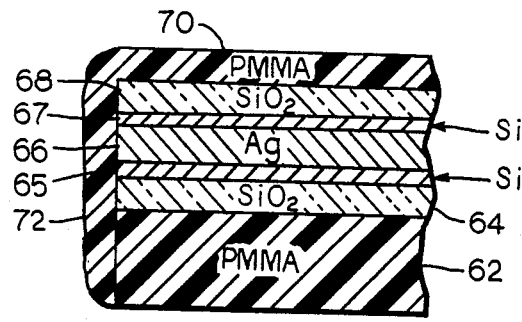
FIG. 1
FIG. 19
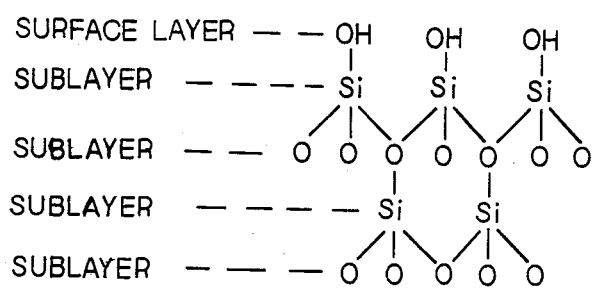
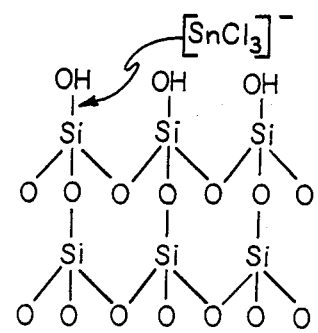
FIG. 2
FIG. 3
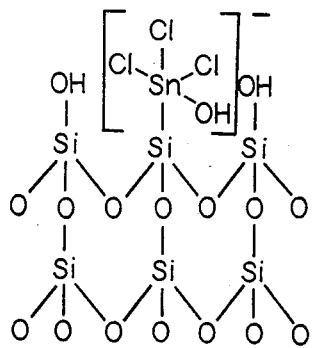
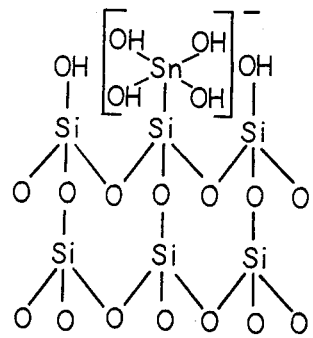
FIG. 4
FIG. 5

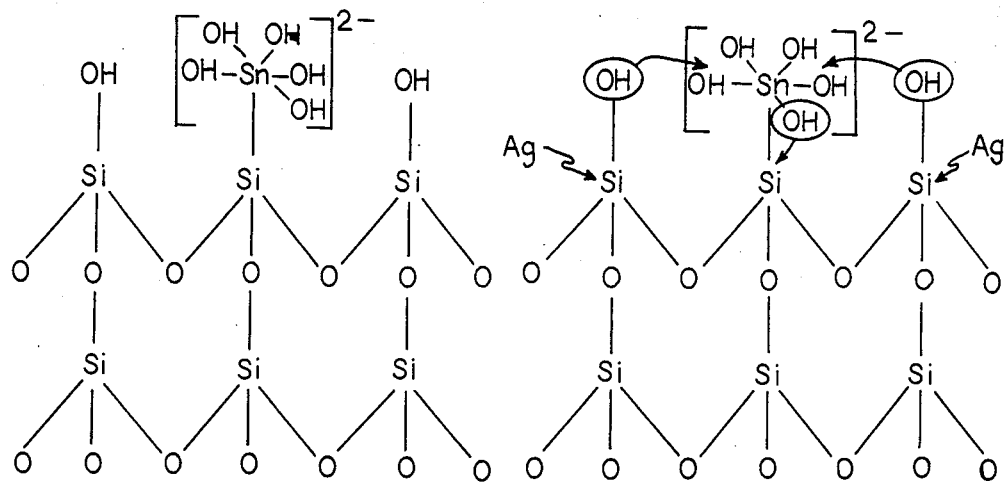
FIG. 6
FIG. 7
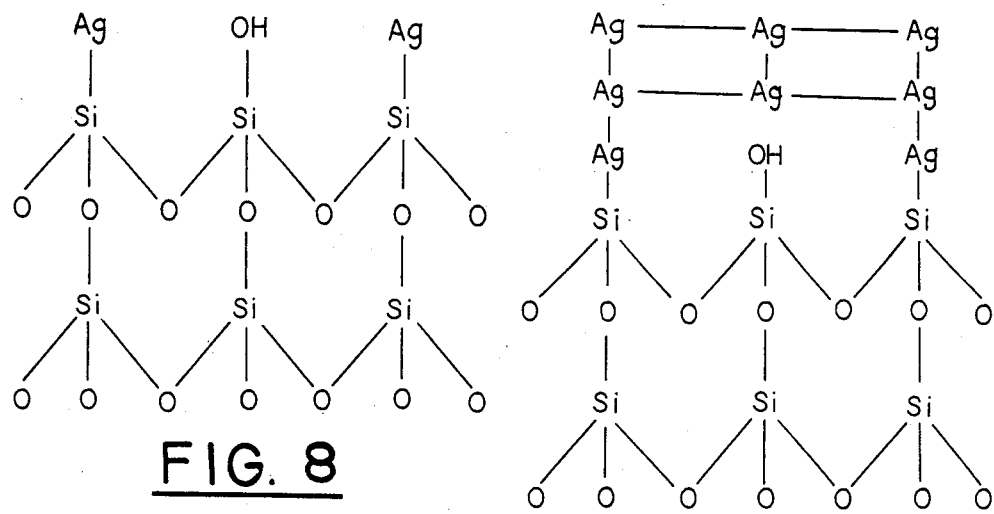
FIG. 8
FIG. 9
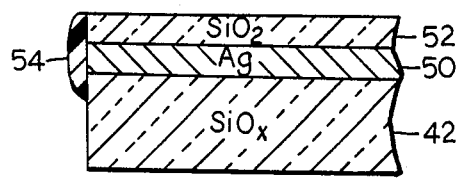
FIG. 17
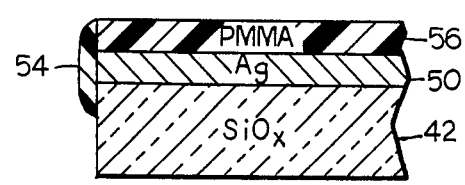
FIG. 18

METHOD OF BONDING SILVER TO GLASS AND MIRRORS PRODUCED ACCORDING TO THIS METHOD

CONTRACTUAL ORIGIN OF THE INVENTION

The U.S. Government has rights in this invention under Contract No. DE-AC02-83CH10093 between the U.S. Department of Energy and the Solar Energy Research Institute, a division of Midwest Research Institute.

BACKGROUND OF THE INVENTION

1. Field of the Invention

The present invention relates to mirrors, and more particularly, to a method of adhering silver to glass.

2. Description of the Prior Art

Mirrors, which are light-reflective surfaces, have been most commonly made over the past century by providing a metallic or amalgam backing on a glass surface. A silver backing is preferred and is capable of providing reflection of the highest quality.

The conventional state-of-the-art methods of coating silver layers on glass surfaces prior to this invention generally fall into three categories, including wet chemical electroless processes, organometallic processes, and vacuum deposition. There are other well-known methods of plating glass surfaces with silver, such as electrolysis; however, the costs of such other processes are prohibitive for commercial use.

Each of the conventional prior art methods of coating a glass surface has specific advantages and disadvantages. However, they have been used successfully and to great advantage for many years in producing high quality mirrors, most of which in the past have been used indoors. With the advent of increased interest in the use of mirrors outdoors for solar collectors, such as heliostats and other solar collector applications over the past decade, the disadvantages and deficiencies of mirrors produced by these conventional methods have become more significant and more acute.

For example, many conventional silvered-glass mirrors are in the form of composite structures. These structures usually consist of a substrate glass layer or pane, a thin reflector layer of silver on the glass surface, a layer of copper over the silver layer, and a protective layer of a paint substance comprised primarily of polymers, carbon, lead, barium, titanium, and other heavy metals. While this kind of mirror structure is satisfactory for many years of service indoors, the reflectance and other desirably optical properties of these mirror structures degrade when placed in a terrestrial environment outdoors. In particular, silver is susceptible to agglomeration, the formation of oxides, sulfides, and chlorides, diffusion between component layers, and de-adhesion or separation of the silver layer from the glass substrate. One example of such conditions involves environmental gases or pollutants, such as combinations of moisture and oxygen, hydrogen sulfide ($H_2S$), sulfur dioxide ($SO_2$), and/or hydrogen chloride (HCl), which diffuse through the layers of paint to react with the copper and the silver reflector layer. Electrochemical reactions also occur at the interface region of the silver reflector layer and the glass substrate, as well as at the side edges of the composite mirror structure. The degradation typically occurs within a few months to a few years, which is an unacceptably short time when a desired lifetime for such equipment is 20 to 30 years.

Although the silvered mirrors produced by the wet chemical electroless processes and by the organometallic methods are susceptible to chemical degradation resulting in loss of reflectivity, the mirrors produced by vacuum deposition processes, such as sputtering and vacuum evaporation, which generally have superior optical qualities and fewer impurities, are more susceptible to de-adhesion of the silver layers from the glass so that the silver layers flake or peel off the glass substrate surfaces. Because of the very large surface areas of mirrors required for commercial scale heliostats and other solar collectors, it is necessary to increase the durability of mirrors manyfold before such installations become economically feasible.

SUMMARY OF THE INVENTION

Accordingly, it is a general object of the present invention to provide a method of producing silvered mirrors that are resistant to chemical degradation, flaking, or peeling when used outdoors in terrestrial environments.

It is also a general object of the present invention to examine the causes of the degradation problems in conventional silvered mirror structures and to provide corrective methods to alleviate such degradation problems.

It is a more specific object of the present invention to minimize the impurities that are incorporated in the silver/glass interface during fabrication of silvered glass mirrors and to maximize the stability of the resulting multilayer mirror configuration.

It is also a specific object of the present invention to obtain significantly increased number of silver-to-silicon bonds in a vacuum deposition process to eliminate flaking and peeling of the silver layer from the glass surface.

Additional objects, advantages, and novel features of the invention shall be set forth in part in the description that follows, and in part will become apparent to those skilled in the art upon examination of the following or may be learned by the practice of the invention. The objects and the advantages of the invention may be realized and attained by means of the instrumentalities and in combinations particularly pointed out in the appended claims.

To achieve the foregoing and other objects and in accordance with the purpose of the present invention, as embodied and broadly described herein, the method and product of this invention may comprise fabricating a mirror by preparing the surface of a glass substrate in a vacuum to be silicon enriched and then depositing a layer of silver on the silicon-enriched substrate surface while it is in the vacuum. It is sometimes desirable, although not considered to always be necessary, to keep the substrate-enriched surface exposed to ultraviolet rays during this process.

There are several methods of silicon enriching the substrate surface by removing the oxygen therefrom, including electron beam bombardment, ion beam bombardment, and neutral beam bombardment. Silicon enrichment of the substrate surface can also be accomplished by depositing a metal, such as aluminum, that has a greater affinity for oxygen than does silicon on the substrate surface. The aluminum will pull the oxygen away from the silicon to form an aluminum oxide layer on the substrate surface that is underlaid with a silicon enriched layer from which the oxygen was removed by the aluminum oxidation process. Heat can be used to enhance this oxidation process. The aluminum oxide layer can then be etched or eroded away, such as by ion beam bombardment in the vacuum, thereby leaving the silicon-enriched substrate surface exposed. Another alternative for attaining a silicon-enriched substrate surface is to vacuum deposit a silicon-rich layer onto the substrate surface.

This invention also includes encapsulating a mirror structure with a polymer. One more desirable mirror structure fabricated according to this invention has a transparent polymer substrate with a vacuum deposited transparent metal oxide diffusion barrier layer on the substrate surface, such as silicon oxide or aluminum oxide. The silver layer is deposited on this diffusion barrier layer, and another similar barrier is deposited on the exposed silver surface. The silver and diffusion layers are then encapsulated by a polymer shell to hermetically seal all the layer surfaces, edges, and interface edges.

BRIEF DESCRIPTION OF THE DRAWINGS

The accompanying drawings, which are incorporated in and form a part of the specifications illustrate preferred embodiments of the present invention, and together with the description, serve to explain the principles of the invention. In the drawings:

FIG. 1 is a cross-sectional illustration of a typical prior art silvered glass mirror structure;

FIG. 2 is an illustration of the atomic lattice structure of glass;

FIGS. 3 through 9 illustrate the changes in the atomic lattice structure as silver is applied to a glass substrate in a wet chemical electroless process;

FIG. 17 illustrates another form of diffusion layer protected mirror structure similar to FIG. 16;

FIG. 18 illustrates in cross section a polymer encapsulated silvered glass mirror structure according to this invention; and FIG. 19 illustrates in cross section a polymer encapsulated mirror structure on a transparent polymer substrate constructed according to this invention.

DETAILED DESCRIPTION OF THE PREFERRED EMBODIMENT

Figure 10:
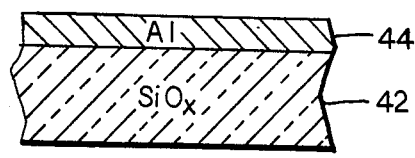
FIGS. 10 through 13 illustrate in cross section the phases of mirror construction according to one of the processes of this invention.

In order to appreciate the advancement in the art of silvered mirror production according to this invention, it is also beneficial to consider the inventors' discovery of the deficiencies in the prior art mirror production methods that cause the degradation, flaking, and peeling problems when exposed to terrestrial environments. The nature of these problem-causing deficiencies has not been recognized or understood prior to this invention. In fact, the nature and characteristics of the silver-to-glass bond have not been recognized or understood prior to this invention. The understanding now gained, as will be described below, contributed to the innovations in mirror construction according to this invention.

A mirror structure 10 fabricated according to a conventional wet chemical electroless process is illustrated in FIG. 1. The glass pane or substrate 12 has a silver (Ag) layer 14 on its surface. A copper (Cu) layer 16 is provided over the silver layer 14, and a protective paint coat 18 is spread over the copper layer 16. The paint coat 18 is usually comprised of a polymer mixed with carbon and several heavy metals, such as lead, barium, and titanium to provide a thick, dense barrier to oxygen and water.

The surface layer of glass in a natural atmosphere has a gel layer thereon formed of hydroxide ions ($OH^-$) bonded to the silicon (Si) atoms of the glass silicon oxide ($SiO_x$) lattice. Therefore, before the silver layer is deposited, the surface of the glass is scrubbed in the conventional wet chemical electroless process for several minutes with an abrasive to remove the gel layer. Most of the gel layer can be removed with this abrasive scrub; however, the presence of oxygen and water always leaves at least one layer of hydroxide ions ($OH^-$) on the surface of the glass, as shown in FIG. 2.

The next step in the conventional wet chemical electroless process is to wash the glass surface with a stannous chloride ($SnCl_2 \cdot 2H_2O$) solution and then to rinse with water. Silver nitrite is then added with a reducing agent, such as sugar, and an additional source of $OH^-$, such as sodium hydroxide (NaOH), to form the silver layer 14. The copper (Cu) layer 16 is put on top of the silver (Ag) layer 14 by using a copper sulfate solution with a reducing agent, such as calcium hydride and iron filings. The structure is then dried under infrared lamps and painted.

As discussed above, mirrors produced according to this conventional wet chemical electroless process provide excellent optical qualities, but they degrade rapidly in outdoor environments. It has not previously been known how the above process works or what constitutes its deficiencies. However, the present inventors have now determined how this process works, what deficiencies contribute to rapid degradation, and how such problems can be avoided. This description will now provide the inventors' analysis of the wet chemical electroless process and an explanation of its deficiencies.

As described above, the lattice shown in FIG. 2 illustrates the top layers of the glass ($SiO_x$) substrate after the gel is scrubbed off the surface leaving a surface layer of hydroxide ($OH^-$) ions bonded to the silicon (Si) atoms at the next adjacent atomic layer. When the surface is washed with the stannous chloride ($SnCl_3$)$^-$ solution, the ($SnCl_3$)$^-$ complex inserts itself into the covalent bond between the Si atom and the OH ion, as illustrated in FIG. 3. The result is the [$SnCl_3(OH)$]$^-$ complex bonded to the Si atom, as shown in FIG. 4.

The surface is then rinsed with water, which eliminates the $Cl^-$ ions, as follows:

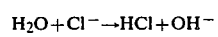

$$H_2O + Cl^- \rightarrow HCl + OH^-$$

The result is that the $Cl^-$ ions attached to the Sn are washed away and replaced by hydroxide ions $OH^-$, as shown in FIG. 5.

An additional $OH^-$ converts the five coordinate Sn complex to a six coordinate Sn complex, shown in FIG. 6, with an additional $OH^-$ ion attached to the Sn. This step is accelerated by raising the pH, such as by adding sodium hydroxide (NAOH). The Ag then attacks and bonds with the Si, thus displacing the OH⁻ ion previously bonded to the Si, as illustrated in FIG. 7, and the two displaced OH⁻ ions join the Sn atom. The Sn then leaves with six OH⁻ ions in the form of $Sn(OH)_6^{2-}$, leaving behind an OH⁻ group to bond to the Si in place of the Sn. The result is two Ag atoms bonded to Si atoms for every one Sn complex bonded to a Si atom, as shown in FIG. 8. Finally, the reducer plates more Ag atoms to a thickness of approximately 700 Å, as shown in FIG. 9. In other words, Ag⁺ ions pick up electrons from the reducer to form silver metal, as follows:

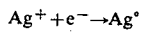

Consequently, as discovered by these inventors, whatever adhesion there is between silver layer 14 to glass substrate 12 obtained in this process results directly from the Ag to Si covalent bonds linking these two elements. Tests by the inventors have shown that in the conventional wet chemical electroless process as described above, however, less than 30% of the available Si atoms are bonded to Sn complexes. This means that less than 60% of the silver can be bonded to the surface silicon. In fact, as shown in FIGS. 8 and 9, the maximum theoretical Ag-to-Si bonding available under perfect conditions in this wet chemical process is only two out of three or 67% of the Si atoms on the top layer, since one out of these three Si atoms retains an OH ion in the process. Consequently, the adherence of the silver layer 14 to the glass substrate 12 has a relatively low theoretical maximum strength and an even lower practical strength.

Further, the characteristic susceptibility to chemical degradation in mirrors 10 fabricated with this kind of wet chemical electroless process is due to impurities, such as the $Sn^{+2}$ and $Cl^-$ ions left at the Ag-to-Si interface in the fabrication process. Copper and impurities from the adjacent copper layer, as well as impurities from the paint layer, also contribute to accelerated degradation of the silver layer, Therefore, these chemical impurities are placed in the mirror 10 and are inherent in the nature of this fabrication process. Consequently, these conventional mirrors 10 are constructed with both inherently weak silver-to-glass bonding, as well as with the chemically active impurities built in to cause self-destruction in a terrestrial environment.

The organometallic method of producing mirrors basically involves the application of complexed silver in organic molecules to the glass substrate. These organometallic solutions are thermally decomposed on the surface of the glass substrate under carefully controlled conditions of solution, composition, firing temperature, and firing atmosphere. For example, the glass substrate is first cleaned with chromic acid and rinsed with distilled water and alcohol. A solution of organic material with complexed silver metal therein is then applied to the substrate by spin-on or spray techniques, either as a single coating or as multiple layers. Finally, the coated substrates are heated to temperatures just below the softening point of glass, or approximately 400° to 700° C.

Testing and analysis by the inventors of the mirrors fabricated by this organometallic process produced results that confirmed their discovery that effective silver-to-glass adhesion or bonding must be the result of Ag-to-Si covalent bonding at the silver-to-glass interface. Adhesion testing with a Sebastian adhesion tester indicated the failure surface under tensile stress at the silver-to-glass interface is about 95% glass and 5% silver. Therefore, the adhesion test failure is primarily cohesive in the glass and indicates strong Ag-to-Si bonding at the silver/glass interface.

The mechanism for the adhesion or bonding at the silver/glass interface in mirrors fabricated with the organometallic process was discovered by the inventors to result from enrichment of Si at the glass substrate surface by destructive oxidation of the organic complex. Their testing and analysis revealed that glass inherently has a high oxygen content. However, the surface layers of glass at the silver-glass interface of mirrors constructed by the organometallic process as described above are nearly devoid of oxygen. During thermal decomposition of the organic complex at 400° to 700° C., reactions occur which attack the glass surface and deplete the oxygen, thereby leaving a silicon-rich layer. Silver in the solution then forms covalent bonds at the oxygen-depleted Si sites. Once a sufficient portion of the glass surface has been covered by covalently bonded silver, the silver metal plates electrolessly onto this surface to form a thick, relatively pure film.

Mirrors fabricated by this organometallic method also exhibit significant susceptibility to chemical degradation in terrestrial environments due to several factors. Gases produced during the thermal decomposition of the organometallic solution cause or at least contribute to voids and roughness in the silver layer surface causing a hazy or milky appearance and reduced reflectivity, which decrease the effectiveness of such mirrors for solar collector applications where high reflectivity is required for economic applications. Also, impurities in the glass substrate migrate to the surface during the organometallic plating process, which renders the silver/glass interface susceptible to chemical degradation when exposed to the ultraviolet rays of the sun and other terrestrial environmental conditions.

It was found that mirrors produced by conventional vacuum deposition processes, such as sputtering or vacuum evaporation, exhibited the best reflectivity (in the range of 97%) and other optical properties desirable for solar collector use. However, adhesion of the silver to the glass substrate is very poor. In fact, it was found that adhesion of the silver films from the organometallic plating process is about ten times stronger than films produced by vacuum evaporating silver onto glass. Apparently there is very little, if any, Ag-to-Si covalent bonding in mirrors produced by conventional vacuum deposition processes.

The inventors' discovery of the Ag-to-Si covalent bond as the mechanism for superior silver-to-glass adhesion in mirrors produced by the wet chemical electroless process and by the organometallic process, along with their discovery of the causes of susceptibility of those mirrors to degradation in outdoor use as solar collectors, contributed to their innovation of the novel processes for adhering silver to glass according to this invention and the vastly superior and durable mirrors produced according to the processes of this invention. These mirrors have extremely strong and a high percentage of covalent Ag-to-Si bonds for strong adhesion of the silver layer to the glass substrate, virtually no impurities at the silver/glass interface to contribute to chemical degradation, and the superior optical qualities of vacuum-deposited silver layer mirrors.

The processes of this invention are directed to maximizing Si enrichment on the glass substrate surface while keeping contaminants and impurities away and vacuum depositing an Ag layer on the Si-enriched surface to obtain maximum Ag-to-Si covalent bonding. Four related methods of adhering silver to glass according to this invention are described below.

The first method is accomplished by initially scrubbing the glass with an abrasive, such as cerium oxide, to remove any surface impurities and gel. Of course, whenever the glass is in air there will be a surface layer of $OH^-$ ions, as shown in FIG. 2, that cannot be eliminated due to moisture in the air. The scrubbed glass substrate is then placed in a vacuum chamber and a vacuum is pulled. A vacuum in the range of $10^{-4}$ Pa to $10^{-6}$ Pa provides satisfactory results in normal circumstances.

With the glass substrate in the evacuated chamber, the surface of the substrate is bombarded with an electron beam to reduce the surface, i.e., to eliminate the oxygen from the surface. A beam in the range of 1,000 to 5,000 volts should be sufficient for this purpose. The electron beam ruptures individual silicon-oxygen bonds. Since the surface oxygen has only one bond attaching it to the substrate, the oxygen leaves, while the silicon remains in the matrix because of the silicon's other bonds. This process continues in the same manner to release oxygen from the silicon oxide ($SiO_x$) of the glass substrate, thus leaving the surface layer of the substrate enriched with Si, which provides dangling bonds or partially filled electron orbits on the substrate surface with which Ag will bond quite readily. The next step therfore is to vacuum deposit Ag on the Si enriched substrate surface, such as by sputtering or vacuum evaporation. The Ag and Si readily form a strong covalent bond to adhere the silver to the substrate surface as long as the substrate remains clean, i.e., as long as the substrate is maintained in a vacuum. Of course, once the surface is covered with Ag, deposition continues to build up additional layers of Ag to the desired thickness.

It is quite feasible in this process to achieve removal of substantial amounts the oxygen from the substrate surface by electron beam bombardment so that the Ag bonds to nearly 100% of the available silicon sites. Further, since no other chemicals are introduced and a vacuum is maintained throughout this entire process, there are virtually no impurities to contaminate the Ag-to-Si interface. The result is a very stongly adherent and extremely pure Ag-to-Si interface, and the resulting silver layer has all of the very high quality reflectivity and other optical properties of vacuum deposited mirrors so desirable and even necessary for effective solar collector applications.

It is possible with a passage of time during the process that the Si ions at the substrate surface could restructure themselves to eliminate the dangling bonds or partially filled electron orbits. However, since Ag-to-Si bonding is more favorable energetically than Si-to-Si bonding, such Si restructuring prior to Ag depostion usually will not hinder the ultimate formation of Ag-to-Si bonding as long as the Si enrichment at the substrate surface is almost pure with virtually all of the oxygen removed. In the event there is a concern in this regard, ultraviolet light will break Si-to-Si bonds. Therefore, exposure of the Si-enriched substrate surface to ultraviolet light during the process will maintain the dangling Si bonds and keep them available for covalent bonding to the Ag atoms.

The second method of this invention is very similar to the first method,. However, rather than using electron beam bombardment for removing oxygen and silicon enriching the substate surface, an ion beam is used to bombard the substrate surface. The ejection of oxygen from the substrate surface using this ion beam bombardment technique results from a mechanism or driving force similar to the electron beam technique, but it is enhanced by the mass of the bombarding ions colliding with the oxygen to also physically erode or preferentially sputter the oxygen from the surface.

A variation of this second method that also is effective is to use a neutral beam bombardment, such as helium, neon, or argon, to sputter the oxygen from the substrate surface, thus leaving silicon-enriched outer layers at the substrate surface. In fact, any technique capable of preferentially removing oxygen from the substrate surface in a vacuum without introducing any impurities or contaminants would be effective to provide the silicon-enriched surface necessary for this process.

A third method of silicon enriching the glass substrate surface is to first scrub the glass surface with an abrasive to remove as much gel as possible. Then place the substrate 42 in a vacuum chamber and evaporate or sputter a layer of aluminum (Al) 44 onto the surface, as shown in FIG. 10. This Al layer 44 can range anywhere from a monolayer of Al atoms to 1000 Å thick or more as desired, as illustrated in FIG. 10.

Figure 11:
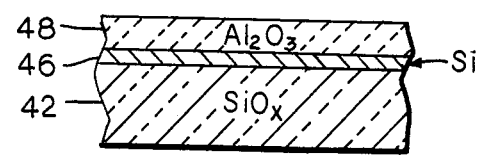

The next step is to heat the substrate 42 and Al layer 44 to a temperature just below the softening temperature of the glass, such as approximately 600° C. The Al will react with the oxygen in the outer layers of the substrate to form aluminum oxide ($Al_2O_3$), thereby extracting the oxygen from the silicon. The resulting structure, as shown in FIG. 11, has three layers. The glass substrate 42 is silicon oxide ($SiO_x$). An intermediate zone 46 of pure silicon (Si) is formed where the oxygen was extracted from the substrate. A layer of aluminum oxide ($Al_2O_3$) 48 is formed where the original Al layer 44 was deposited.

Figure 12:
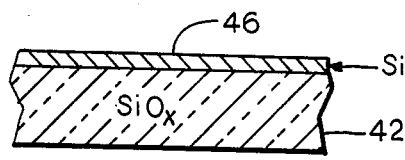
Figure 13:
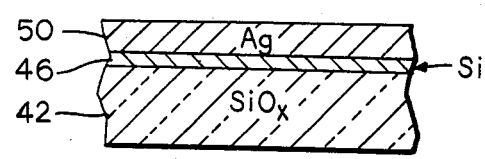

While maintaining the vacuum, the layer 48 of $Al_2O_3$ is etched away by ion beam or neutral beam bombardment to expose the pure layer 46 of Si, as shown in FIG. 12. Finally, the Ag layer 50 is vacuum deposited onto the Si layer 46 where it forms a strong covalent Ag-to-Si bond, as shown in FIG. 13 and as described in the methods discussed above. Again, since this method provides a pure silicon enriched surface in a vacuum without introducing impurities or contaminants, the resulting Ag-to-Si covalent bond is very strong and durable and has the high quality optical properties characteristic of vacuum-deposited silvered mirrors. It should be noted that metals other than Al that also have a stronger affinity to oxygen than silicon, such as zirconium, chromium, or titanium, could also be used instead of aluminum.

Figure 14:
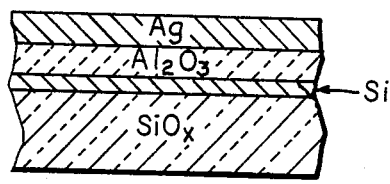
FIG. 14 illustrates in cross section a mirror constructed according to a variation of a process of this invention.
Figure 15:
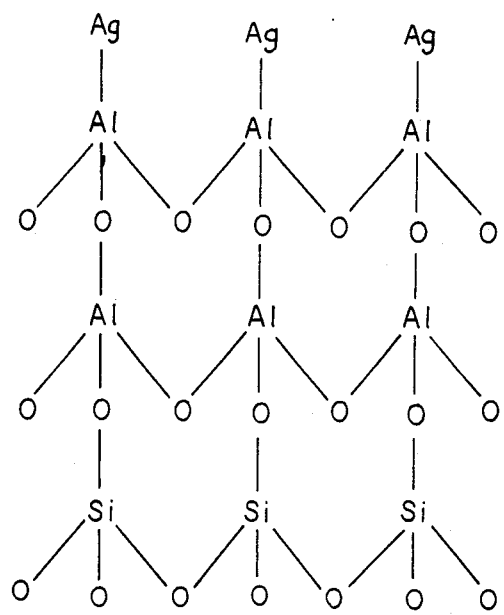
FIG. 15 illustrates the resulting atomic lattice structure of the mirror in FIG. 14.

A variation of this third method is to leave the $Al_2O_3$ layer 48 shown in FIG. 11, rather than etching it off. Then, since Al acts like Si in this kind of lattice structure, an Ag layer 50 can be vacuum deposited on the $Al_2O_3$ layer 48, as shown in FIG. 14. The resulting lattice structure would be something like that illustrated in FIG. 15.

A fourth method of providing a silicon-enriched layer on the substrate surface is to vacuum deposit pure Si on the scrubbed surface of the $SiO_x$ substrate to obtain a structure such as that shown in FIG. 12. Then an Ag layer 50 can be vacuum deposited on the Si layer to obtain the mirror structure shown in FIG. 13.

Figure 16:
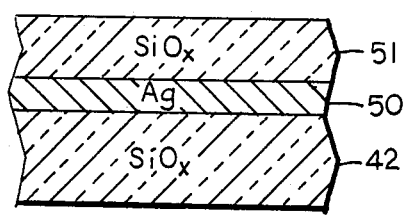
FIG. 16 illustrates in cross section a diffusion layer protected silver layer in a mirror structure.

Once the mirror structure is obtained according to this invention as described above, the silvered reflective layer 50 can be protected and made more durable by encapsulating it in a material impervious to air and moisture, because silver is reactive with oxygen and will corrode or tarnish. In this way, copper and paint layers with their associated deleterious effects on the silver layer, as described above, are avoided. For example, as shown in FIG. 16, a thin glass layer 51 can be laminated over the silver layer 50 to sandwich the silver layer 50 between the glass substrate 42 and the glass layer 51. Another sealing structure is shown in FIG. 17, wherein a $SiO_2$ layer 52 is vacuum deposited over the silver layer 50. The ends or edges are sealed by end caps 54 formed of a thick epoxy or acrylic bonding material or by heat or laser fusion of the glass edges.

Another sealing structure is shown in FIG. 18 wherein a plastic material 56, such as polymethylmethacrylate (PMMA), is coated on top of the silver layer 50. PMMA, which is one of the most diffusion-resistant polymers available commercially, can be applied as a liquid in solution, and then the solvent can be allowed to evaporate leaving a tough, substantially impermeable seal layer 56.

A novel composite sealed silver mirror structure 60 fabricated according to this invention is shown in FIG. 19, which is durable, lightweight, and protected from degradation in the terrestrial environment. A polymer substrate 62, such as PMMA, has vacuum deposited thereon a layer 64 of $SiO_2$ that serves as a diffusion barrier. The surface 65 of the $SiO_2$ layer 64 is silicon enriched as described above, and the silver layer 66 is vacuum deposited on this silicon-enriched surface. Another diffusion barrier layer 68 of $SiO_2$ is vacuum deposited on the silver layer 66. This step can be initiated or preceded by vacuum depositing a silicon-enriched coating 67 on the silver layer 66 to promote enhanced adhesion of the $SiO_2$ layer 68 to the silver layer 66. This assembly can then be removed from the vacuum and coated with a polymer superstrate layer 70 on the top and over the edges 72.

It is important that the process of this invention for silicon enriching a glass substrate and depositing silver in the silicon enriched surface in a vacuum is applicable to any process requiring strongly adhering silver to a silica substrate, such as thermally grown silicon dioxide in the production of electronic circuits.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalence may be resorted to falling within the scope of the invention as defined by the claims which follow.

The embodiments of the invention in which an exclusive property or privilege is claimed are defined as follows:

1. The method of adhering silver to the surface of a glass substrate, comprising the steps of:
    placing the glass substrate in an evacuated chamber;
    enriching the surface of the glass substrate with silicon atoms while the surface of the glass substrate is in the evacuated chamber so as to substantially eliminate the oxygen from the surface of the glass substrate and to substantially protect the surface from impurities and contaminants; and
    depositing silver atoms on the silicon-enriched surface of the glass substrate while the glass substrate is in the evacuated chamber, and wherein eliminating the oxygen from the surface of the glass substrate and protecting the surface from impurities enables a bond to be formed between the silicon atoms and silver atoms which has sufficient strength and durability to withstand degradation caused by terrestrial environmental conditions.

2. The method of claim 1, wherein the step of silicon enriching the substrate surface is accomplished by the step of bombarding the surface of the glass substrate with a beam of electrons.

3. The method of claim 1, wherein the step of silicon enriching the substrate surface is accomplished by the step of bombarding the surface of the glass substrate with a beam of ions.

4. The method of claim 1, wherein the step of silicon enriching the substrate surface is accomplished by the step of bombarding the surface of the glass substrate with a neutral beam.

5. The method of claim 1, wherein the step of silicon enriching the substrate surface is accomplished by the step of depositing a layer of silicon on the surface of the glass substrate .

6. The method of claim 1, wherein the step of silicon enriching the substrate surface is accomplished by the step of depositing a layer of metal that has a greater affinity for oxygen than silicon on the surface of the glass substrate, allowing the metal to react with the oxygen in the glass substrate surface layer to form metal oxide over a layer of oxygen-reduced, silicon-enriched substrate.

7. The method of claim 6, including the additional step of etching the layer of metal oxide off the substrate to expose the silicon-enriched surface layer of the substrate.

8. The method of claim 7, wherein the step of etching the metal oxide off the substrate is accomplished by ion beam bombardment of the metal oxide layer until the metal oxide layer is completely removed from the substrate.

9. The method of claim 7, wherein the step of depositing a layer of metal on the substrate surface is accomplished by depositing aluminum on the substrate surface.

10. The method of claim 7, including the additional step of heating the substrate after the metal layer is deposited thereon to a temperature approaching, but not reaching, the softening temperature of the glass substrate to enhance oxidation of the metal on the surface of the substrate.

11. The method of claim 1, including the step of shining ultraviolet rays on the substrate surface during the steps of silicon enriching the substrate surface and depositing silver thereon.

12. A process for forming a silvered-glass mirror having a silver layer substantially impervious to separation due to environmental weathering, said process comprising the steps of:
    placing a glass substrate in an evacuated chamber;
    reducing a surface of the glass substrate in the chamber such that the surface of the glass substrate is substantially devoid of oxygen and comprised substantially of only a metal-like silicon layer;
    depositing and bonding a layer of silicon on said reduced surface to form a composite structure so as to effect formation of direct silver-to-silicon covalent bonding, and wherein reducing the surface of the glass substrate substantially enhances adhesion of the silver layer to the glass substrate as defined by the properties of such covalent silver-to-silicon covalent bonds.

13. The process of claim 12, including the additional steps of dissolving a polymer that is free of heavy metals, fluorides chlorides, and sulfides in a suitable solvent to obtain a liquid form, spreading the dissolved polymer over the silver layer and over the edges of the silver layer and the silver-to-glass interface, and allowing the solvent to evaporate leaving the silver layer and the edges of the silver and the silver-to-glass interface encapsulated and sealed by hardened polymer.

14. A silvered-glass mirror capable of providing protection against moisture and other forms of environmental weathering having a structure fabricated by a process comprising the steps of:

placing a polymer substrate in an evacuated chamber;

depositing a layer of transparent metal oxide on a surface of the polymer substrate;

enriching the exposed surface of the metal oxide layer with silicon atoms;

depositing a silver layer on the silicon-enriched surface of the metal oxide layer;

depositing a metal oxide layer over the exposed surface of the silver layer;

removing this composite structure of metal oxide and silver layers bonded to the polymer substrate from the evacuated chamber and encapsulating the composite structure, including the interface edges of all said layers with each other and with the substrate with a dissolved polymer in liquid form, and allowing the solvent to evaporate, leaving a hardened polymer shell that hermetically seals the metal oxide and silver layers and the layer-to-substrate interface edges from the atmosphere.

15. The mirror structure of claim 14, wherein the metal oxide deposited on said substrate surface is silicon oxide.

16. The mirror structure of claim 14, wherein the metal oxide deposited on said substrate surface is aluminum oxide.

17. The mirror structure of claim 15, wherein the fabricating process also includes the step of depositing a silicon-rich layer on the exposed surface of the silver layer and then depositing a layer of silicon oxide on the silicon-rich layer.

* * * * *